(12) United States Patent
Kwak

(10) Patent No.: US 6,917,640 B2
(45) Date of Patent: Jul. 12, 2005

(54) VERTICAL CAVITY SURFACE EMITTING LASER AND METHOD FOR FABRICATING THE SAME

(75) Inventor: Kyu-Sub Kwak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/447,017

(22) Filed: May 28, 2003

(65) Prior Publication Data

US 2004/0120376 A1 Jun. 24, 2004

(30) Foreign Application Priority Data

Dec. 18, 2002 (KR) .................... 10-2002-0081041

(51) Int. Cl.[7] .................... H01S 3/08; H01S 5/00
(52) U.S. Cl. .................... 372/96; 45/46
(58) Field of Search .................... 372/43–46, 92, 372/96–99

(56) References Cited

U.S. PATENT DOCUMENTS 5,729,566 A * 3/1998 Jewell .................... 372/96
6,658,040 B1 * 12/2003 Hu et al. .................... 372/96
2004/0081215 A1 * 4/2004 Johnson et al. .................... 372/45
2004/0101009 A1 * 5/2004 Johnson et al. .................... 372/45

* cited by examiner

*Primary Examiner*—Minsun Oh Harvey
*Assistant Examiner*—Phillip Nguyen
(74) *Attorney, Agent, or Firm*—Cha & Reiter, L.L.C.

(57) ABSTRACT

A vertical cavity surface emitting laser (VCSEL) is provided with an aperture for guiding a flow of electric currents. The aperture is defined by an oxide so that the aperture is formed to be substantially circular in shape. A method for fabricating the laser is also disclosed. The structure of the (VCSEL) makes it possible to control the oxidation rates of an oxidable layer in which an aperture is formed for guiding the flow of electric currents of a VCSEL, by forming a mesa trench of the VCSEL in a segmented structure which has a predetermined number of segments. Accordingly, it is possible to form an aperture approximately in a circular shape, so that the light emitting angle and shape of the VCSEL are easily controlled.

26 Claims, 7 Drawing Sheets

VERTICAL CAVITY SURFACE EMITTING LASER AND METHOD FOR FABRICATING THE SAME

CLAIM OF PRIORITY

This application claims priority to an application entitled "Vertical Cavity Surface Emitting Laser and Method for Fabricating the Same," filed with the Korean Intellectual Property Office on Dec. 18, 2002 and assigned Serial No. 2002-81041, the contents of which are hereby incorporated by reference.

BACKGROUND OF THE INVENTION

1. Field of the Invention

The present invention relates to a vertical cavity surface emitting laser. More particularly, the present invention relates to a vertical cavity surface emitting laser, which is provided with an aperture for guiding a flow of electric currents, wherein the aperture is defined by an oxide so that the aperture is formed approximately in a circular shape, and a method for fabricating the laser.

2. Description of the Related Art

In the prior art, unlike an edge emitting laser, a vertical cavity surface emitting laser (VCSEL) emits a Gaussian beam that is formed approximately in a circular shape in the laminating direction of semiconductor layers, so that the VCSEL does not require an optical system for correcting the emitted shape of the light. Furthermore, because it is possible to reduce the size of a VCSEL so that a plurality of VCSELs can be integrated on a single semiconductor wafer, it is easy to array the VCSELs in two dimensions. Due to this advantage, VCSELs find wide application in the optical fields, such as the optical communication field, electronic calculators, audio/video appliances, laser printers, laser scanners, medical appliances, etc.

Such a VCSEL includes one or more insulation regions formed in an upper reflector layer in order to enhance an optical output performance by guiding a flow of electric currents delivered through an electrode. Such an insulation region may be formed by two different processes: (1) an ion implantation process, in which an upper reflector layer is formed and then protons, ions and the like are implanted; and (2) a selective oxidation process, in which peripheral areas except a current guide region are oxidized by controlling time. The ion implantation process is advantageous with regard to product yield and the readiness in the fabrication of products. However, the ion implantation process has drawbacks in that a resulting device can have a defective performance during high-speed operation, because it is difficult to control a leakage current, and in that reproducibility is poor in mass production because implanted protons are not uniformly distributed.

By comparison, in the selective oxidation process, the periphery of a plurality of surface emitting lasers grown on a single substrate is etched away in a state in which a part of a layer under an upper reflector layer, i.e., a portion intended to be formed with an insulation region, is laminated with an AlGaAs layer, and then the AlGaAs layer is diffusedly oxidated inward by controlling the length of time within an oxidation environment, as a result of which an $Al_2O_x$ oxidation insulation film, i.e. an insulation region for limiting a flow of electric currents, is formed.

Figure 1:
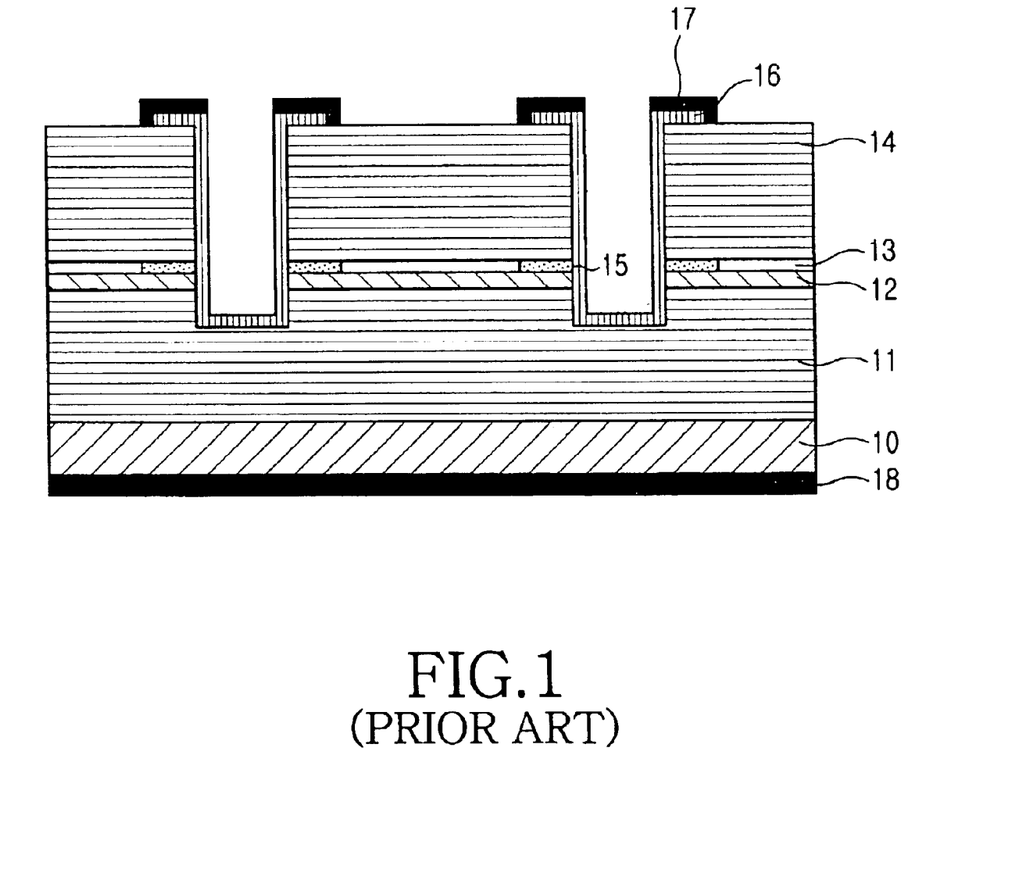
FIG. 1 is a cross-sectional view which shows a structure of a vertical cavity surface emitting laser formed by a conventional selective oxidation process.

FIG. 1 is a cross-sectional view which shows a structure of a VCSEL formed by the conventional selective oxidation process. FIGS. 2a to 2d are stepwise cross-sectional views which show a procedure of fabricating a VCSEL, and FIG. 3 is a photograph taken by an infrared camera, which shows the plan view of the VCSEL in the step shown in FIG. 2c. The structure of a VCSEL formed by means of a conventional selective oxidation process and the steps for fabricating the VCSEL will now be described with reference to these drawings.

As shown in FIG. 1, a VCSEL structure comprises a semiconductor substrate 10, a lower reflector layer (n-DBR: Distributed Bragg Reflector) 11, an active layer 12, an upper reflector layer (p-DBR) 14, at least one insulation region 15, an insulation film 16, at least one upper electrode 17, and a lower electrode 18.

Figure 2A:
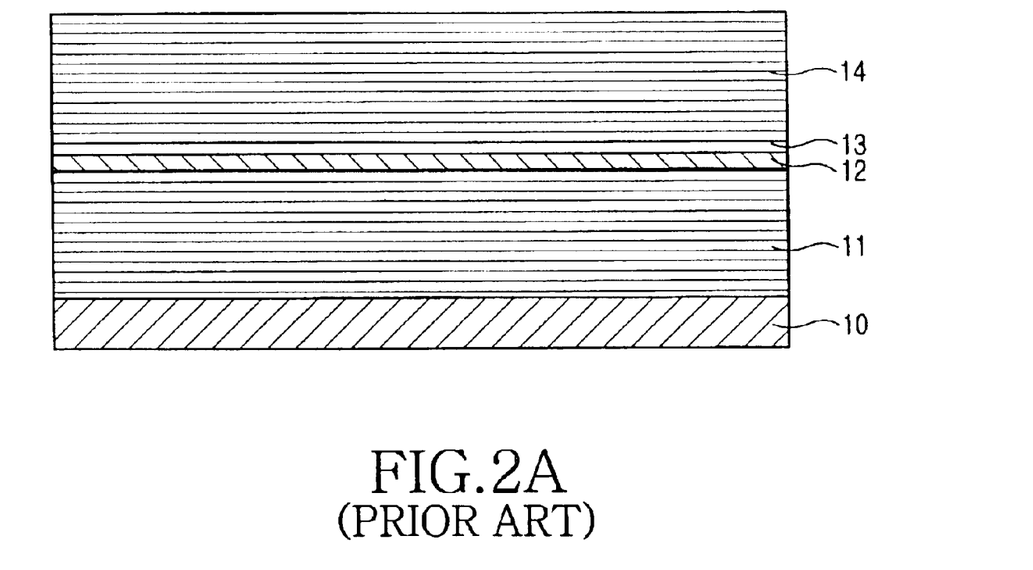
FIGS. 2a to 2d are stepwise cross-sectional views, which show the steps of fabricating a conventional vertical cavity surface emitting laser.
Figure 3:
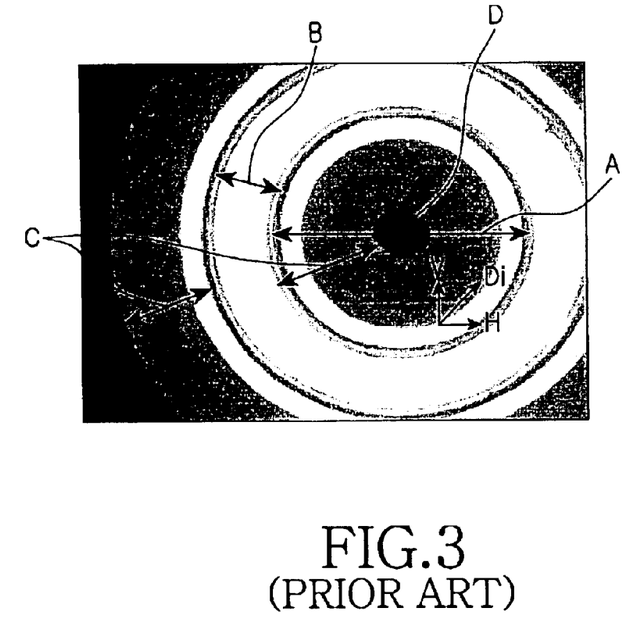
FIG. 3 is a photograph taken using an infrared ray camera, which shows the plan view of the conventional vertical cavity surface emitting laser in the step of FIG. 2c.

In the fabrication process, at first, the lower reflector layer 11, the active layer 12, and the upper reflector layer 14 are laminated on the semiconductor substrate 10, as shown in FIG. 2a. Here, an oxidable layer (AlAs) 13, which will form the insulation regions 15 through a subsequent oxidation step, is intervened between the active layer 12 and the upper reflector layer 14.

Figure 2B:
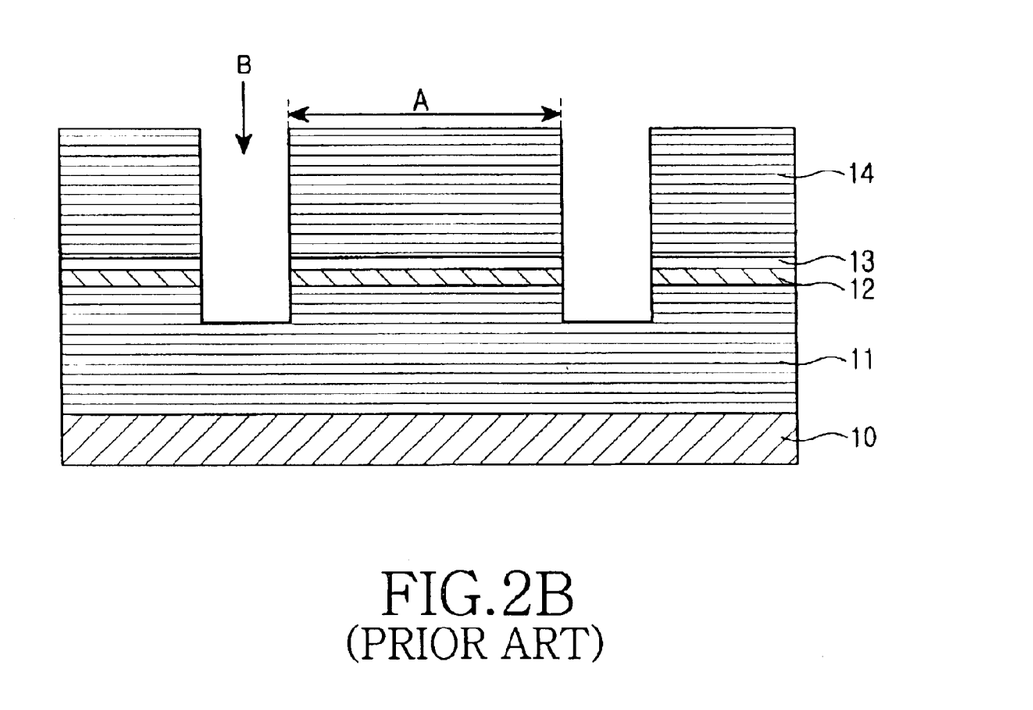
Figure 2C:
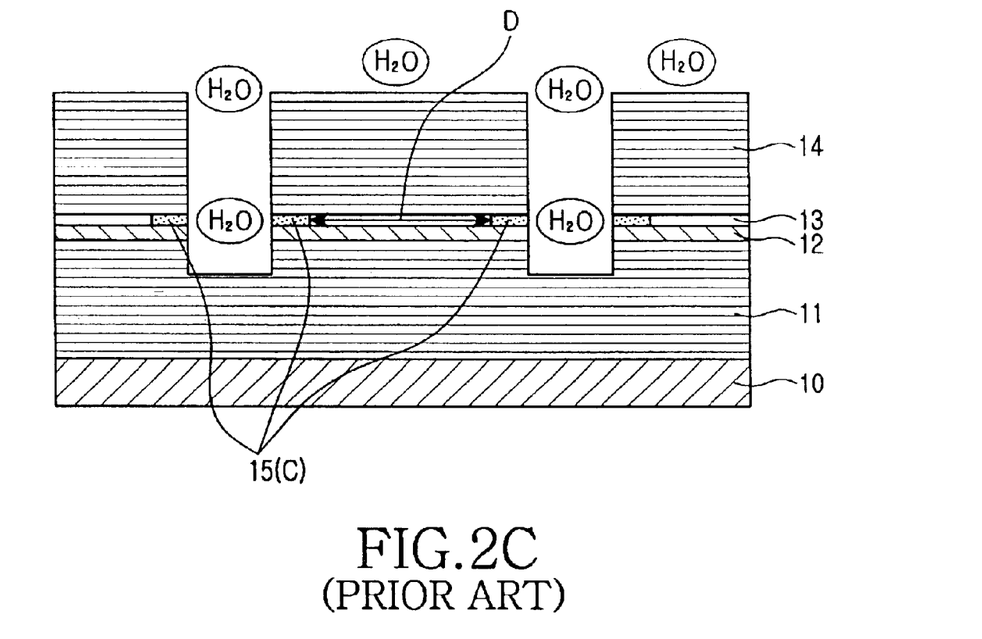

Next shown in FIG. 2B, a mask pattern is formed on the upper reflector layer 14 and then a trench B is formed by mesa A etching using a dry etching process, so that the oxidable layer 13 can be exposed to an oxidation environment. If an oxidation environment is developed for a predetermined length of time after the trench B is formed, the oxidable layer 13 is oxidated inward from the parts exposed by the trench B, thus forming a plurality of insulation regions 15, C of $Al_2O_3$, as shown in FIG. 2c. Here, a selective oxidation process is carried out so that the central region of the oxidable layer 13 is not oxidated. The non-oxidated region of the oxidable layer 13 surrounded by the oxidated insulation regions 15, C is called as oxidation aperture D, by means of which the emission shape of light outputted from the VCSEL is determined.

FIG. 3 is a plan view after the selective oxidation process (the step shown in FIG. 2c), from which drawing the structure of the trench B can be seen which is formed by mesa A etching and the shapes of the insulation regions C and the oxidation aperture D can also be seen in detail.

Figure 2D:
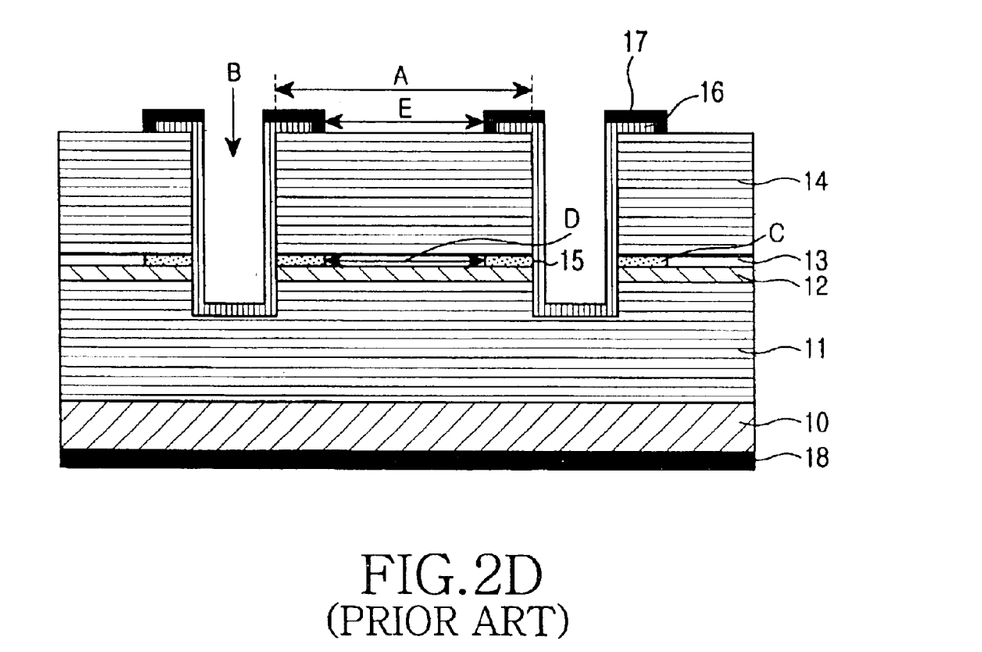

As shown in FIG. 2d, the insulation film 16 and the upper electrodes 17 are formed, and the lower electrode 18 is formed on the lapped bottom surface of the substrate 10, thereby completing the fabrication of the VCSEL. Here, the upper electrodes 17 are formed with a window by a metal aperture E so that light produced from the active layer 12 can exit, wherein the upper electrodes 17 are independently formed for each VCSEL, so that one VCSEL can be driven independently from an adjacent VCSEL.

The VCSELs of the above structure can be used in a one-chipped array structure or can be individually used by being separated from each other.

However, the most serious problem of a VCSEL formed by the selective oxidation process is that the far field pattern (FFP) control is very difficult. The FFP control is preformed in two ways, one of which is to control the light-emitting angle and the other of which is to control the light-emitting shape. In controlling the light-emitting angle, it is possible to find out an appropriate value by controlling the sizes of the metal aperture and the oxidation aperture. Whereas, because the emitting shape is determined by the shape of the oxidation aperture, it is not easy to control the light-emitting shape. Due to the lattice directionality of a semiconductor, oxidation rates are varied even if oxidation processes are performed for a same length of time under the same conditions. Eventually, as shown in FIG. 3, the oxidation rate is faster in the diametric direction Di than either in the vertical direction V or in the horizontal direction H, as a result of which the oxidation aperture is formed in a diamond shape rather than in a circular shape, thereby bringing difficulties in controlling the light-emitting shape.

SUMMARY OF THE INVENTION

The present invention is related to a vertical cavity surface emitting laser which has an oxidation aperture formed nearly in a circular shape by overcoming the difference of oxidation rates due to the lattice directionality of a semiconductor, and a method for fabricating the vertical cavity surface emitting laser.

In one embodiment, a vertical cavity surface emitting laser includes: a substrate; a lower reflector layer laminated on the substrate; an active layer formed on the lower reflector, the active layer generating light; one or more insulation regions formed on the active layer to define an aperture for guiding a flow of electric currents; an upper reflector layer laminated on the insulation regions; one or more segmented trenches, the depth of which is extended through the upper reflector layer and the active layer, and into at least a part of the lower reflector layer, wherein the segmented trenches a reformed in order to control the oxidation rate of an oxidable layer which forms the insulation regions; an insulation film formed to cover the bottom and side walls of the segmented trenches; at least one upper electrode formed on the upper reflector layer; and a lower electrode formed on the bottom surface of the substrate.

It is preferable that the segmented trenches are formed around a predetermined location on the oxidable layer so that a smaller area of a more rapidly oxidable portion comes into contact with water vapor during an oxidation process for forming the insulation regions.

It is also preferable that the oxidation rate is determined by the sizes and numbers of the segmented trenches.

According to another aspect of the present invention, there is provided a method for fabricating a vertical cavity surface emitting comprising the steps of: providing a substrate; laminating a lower reflector layer, an active layer, an oxidable layer, and an upper reflector layer on the substrate; forming a mask pattern of a segmented structure on the upper reflector layer and then forming one or more segmented trenches in accordance with the segmented structure by performing an etching process using the mask pattern as an etching pattern, wherein the depth of the segmented trenches is extended through the upper reflector layer, the oxidable layer and the active layer, and into at least a part of the lower reflector layer; exposing the oxidable layer to an oxidation environment for a predetermined length of time so that the oxidable layer is selectively oxidated, thereby forming one or more insulation regions, the central part of which is formed with an aperture; forming an insulation film to cover the bottom and side walls the segmented trenches and on the portions of the upper reflector layer surrounding the segmented trenches so that at least a part of the upper reflector layer is exposed, thereby forming a window; forming at least one upper electrode on the insulation film, wherein the upper electrode is in contact with the upper reflector layer at the periphery of the window; and forming a lower electrode on the bottom surface of the substrate.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. It is to be noted that the same elements are indicated with the same reference numerals throughout the drawings. For the purposes of clarity and simplicity, a detailed description of known functions and configurations incorporated herein will be omitted when it may make the subject matter of the present invention and/or the drawings unclear.

Figure 4:
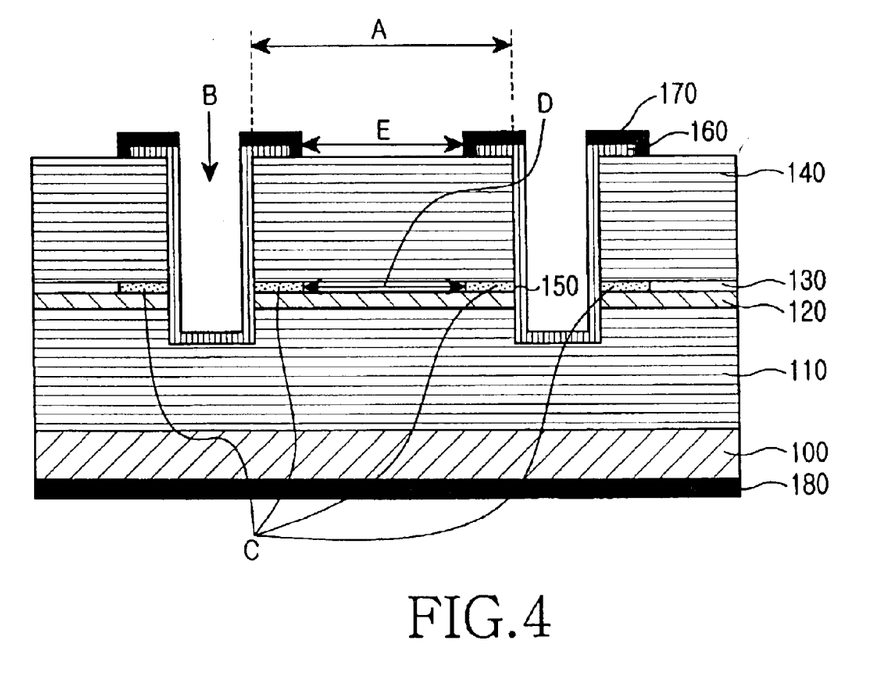
FIG. 4 is a cross-sectional view which shows a vertical cavity surface emitting laser according to an embodiment of the present invention.

FIG. 4 is a cross-sectional view which shows a vertical cavity surface emitting laser (VCSEL) according to a preferred embodiment of the present invention.

Referring to FIG. 4, the VCSEL comprises a substrate 100, a lower reflector layer 110 laminated on the substrate 100, an active layer 120, a plurality of insulation regions 150 formed by partial oxidation, an upper reflector layer 140, an insulation layer 160, a plurality of upper electrodes 170, and a lower electrode 180 formed on the bottom surface of the substrate 100.

The substrate 100 is formed from a semiconductor material such as Ga, As, and the like which contains, for example, an n-type impurity, wherein a plurality of VCSELs can be concurrently formed on the substrate through an identical process.

Formed on the semiconductor substrate 100 is the lower layer (n-DBR) 110, which is formed by laminating twenty or more layers of a same conductive type impurity, for example, of n-type $Al_xGa_{1-x}As$ of different composition. The upper reflector layer 140 is formed from a semiconductor material identical in composition with the lower reflector layer 110, wherein the upper reflector layer 140 contains impurity of a conductive type opposite to that of the impurity contained in the lower reflector layer 110. The upper reflector layer 140 and the lower reflector layer 110 are caused to flow electrons and holes by electric currents applied through the upper and lower electrodes 170, 180.

The active layer 120 is a region which generates light due to energy transition caused by recombination of electrons and holes and may have either a single or multiple quantum-well structure, a super lattice structure, etc.

The insulation regions 150, which are formed from a semiconductor layer oxidated by a selective oxidation process, are arranged between the active layer 120 and the upper reflector layer 140. Here, the non-oxidated region is called an oxidation aperture D and is surrounded by the insulation regions 150, (bracketed "C"). The oxidation aperture D should be formed in a circular shape if possible and the emitting shape of the light outputted from the VCSEL is determined by the shape of the aperture. However, due to the lattice structure of the semiconductor layer, oxidation rates are varied even if the oxidation processes are performed for a same length of time in a same condition, as described above. According to the present invention, when forming a trench (mesa etching), at least a more rapidly oxidable portion in the semiconductor layer, which will form the insulation regions, is left without being etched away in order to reduce the area to be contacted with vapor. That is, a predetermined number of segmented trenches are formed.

Figure 5:
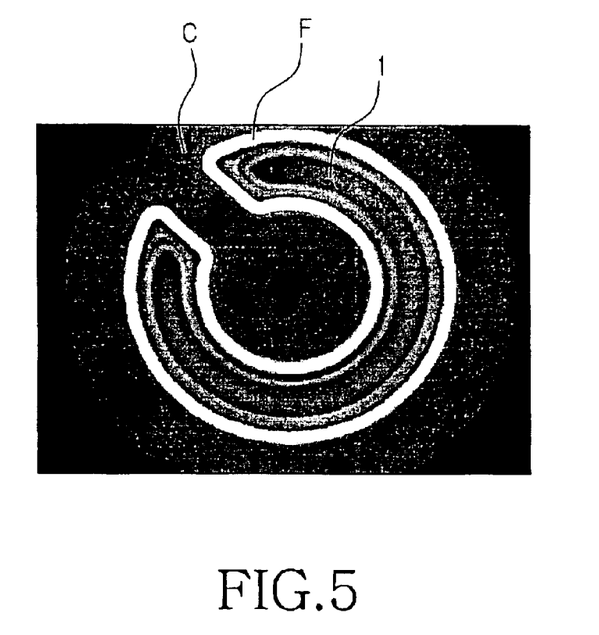
FIG. 5 is a photograph taken using the infrared ray camera, which shows the plan view of a vertical cavity surface emitting laser with a one-segment structure according to another embodiment of the present invention.

FIG. 5 is a photograph taken using an infrared camera, which shows a plan view of a VCSEL having one segment structure according to an embodiment of the present invention. The plan view is presented to describe the structure of the trench. As compared to the conventional structure shown in FIG. 3, one segmented trench 1 is formed so that a part of the periphery of the mesa A is left without being etched away. Referring to FIG. 3, the mesa trench takes a shape of donut because the mesa trench is formed by etching all around the mesa. In FIG. 5, referential symbol C designates oxidated portions and referential symbol F designates a partially oxidated portion which contains a relatively high content of Al in the upper reflector layer.

Figure 6:
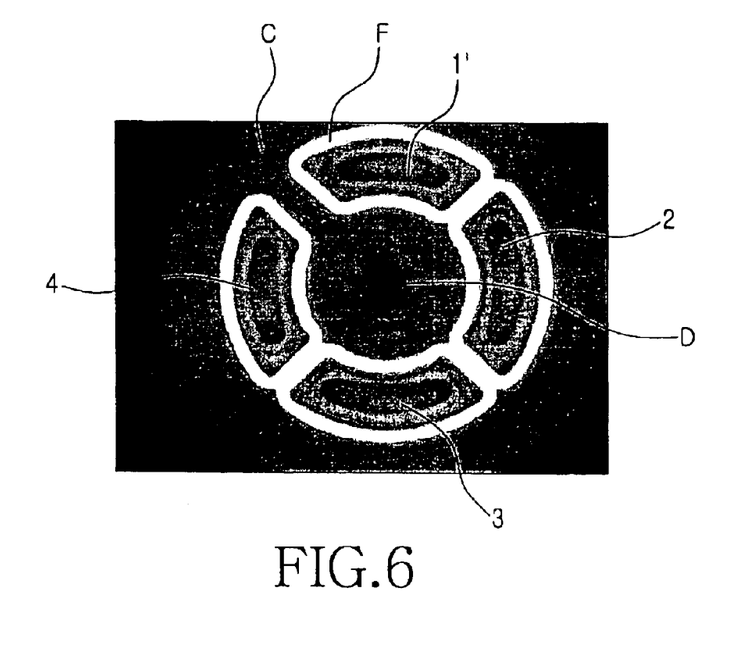
FIG. 6 is a photograph taken using the infrared ray camera, which shows a vertical cavity surface emitting laser with a four-segment structure according to yet another embodiment of the present invention.

FIG. 6 is a photograph taken using the infrared camera, which shows a plan view of a vertical cavity surface emitting laser with a four-segment structure according to an embodiment of the present invention. In the four-segment structure, four segmented trenches 1', 2, 3, 4 are formed in the horizontal and vertical directions around the mesa, except two diametric directions in which oxidation rates are more rapid. It can be seen that there is formed an oxidation aperture D of approximately a circular shape as the more rapidly oxidable portions are left without being etched away in the above manner and thus the area contacted with water vapor is reduced. Here, because the oxidation rate may be varied depending on the sizes and number of segmented trenches and the thickness of the oxidable semiconductor layer, it is possible to control the size and shape of the oxidation aperture D by suitably controlling these parameters. In FIG. 6, referential symbol C designates oxidated portions and referential symbol F designates a partially oxidated portion which contains a relatively high content of Al in the upper reflector layer.

Referring to FIG. 4 again, the insulation film 160 is formed on the entire area of the upper reflector layer 140 except an window, through which light will be emitted from the upper reflector layer 140, and the periphery thereof. The insulation film 160 may be formed from $SiO_2$, etc.

The upper electrodes 170 are formed on the insulation film 160 and contacted with the upper reflector layer 140 around the window. Here, the size of the window formed by the metal aperture E is defined by the space of the upper electrodes and is made not to exceed about 14 $\mu$m.

While the preferred embodiment of the present invention has been described with reference to a single VCSEL as an example, it is possible to form an array construction in which a plurality of VCSELS are integrally formed on a single substrate. In this case, a spacing portion is formed between adjacent VCSELs beyond one or more trenches to separate respective VCSELs, so that each of the VCSELs can be independently driven.

Herein below, a fabricating process of a VCSEL according to the preferred embodiment of the present invention will be described in detail with reference to FIGS. 7a to 7d.

Figure 7A:
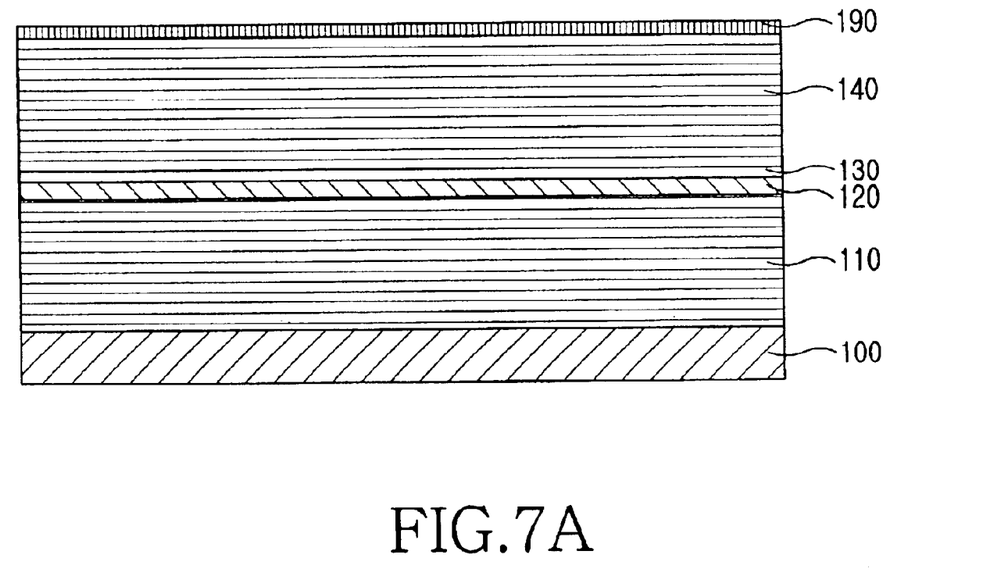
FIGS. 7a to 7d are stepwise cross-sectional views showing the steps of fabricating a vertical cavity surface emitting laser according to an embodiment of the present invention.

At first, the lower reflector layer 110, the active layer 120, the oxidable layer 130, and the upper reflector layer 140 are laminated on the semiconductor substrate 100. The oxidable layer 130, which is formed of a layer of a semiconductor material such as AlAs, etc, is a layer in which the insulation regions 150 will be formed through an oxidation process to be performed later. On the upper reflector layer 140, a protection layer 190 may be coated for preventing the upper reflector layer 140 from being oxidated in the oxidation process to be described later. The protection layer 190 is formed of an insulation film of $SiO_2$ or the like, and is made to be easily removed through a dry or wet etching process after the oxidation process.

Figure 7B:
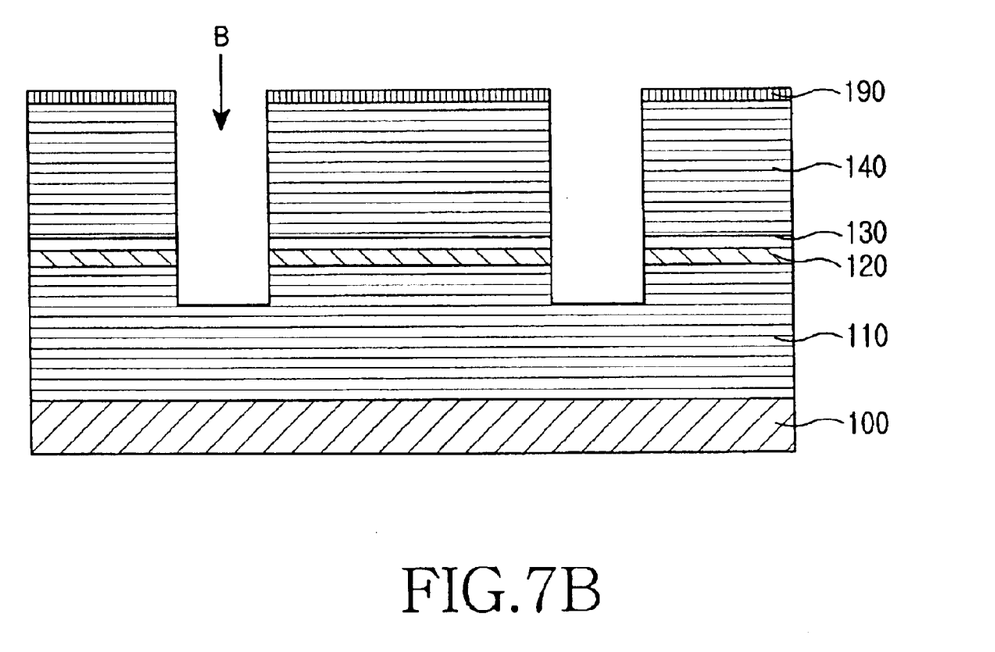

Next, a mask pattern is formed on the upper reflector layer 140 or the protection film 190, and then a dry etching is carried to form one or more segmented trenches, the depth of which is extended through the upper reflector layer 140, the oxidable layer 130 and the active layer 120 and into at least a part of the lower reflector layer 110. Here, if the oxidation rate is not equal in respective directions (for example, due to the lattice directionality), the mask pattern of a segmented structure as shown in FIG. 6 is formed, so that the periphery of a more rapidly oxidable portion may be left without being etched away, as a result of which the more rapidly oxidable portion will be less exposed to the oxidation environment.

Figure 7C:
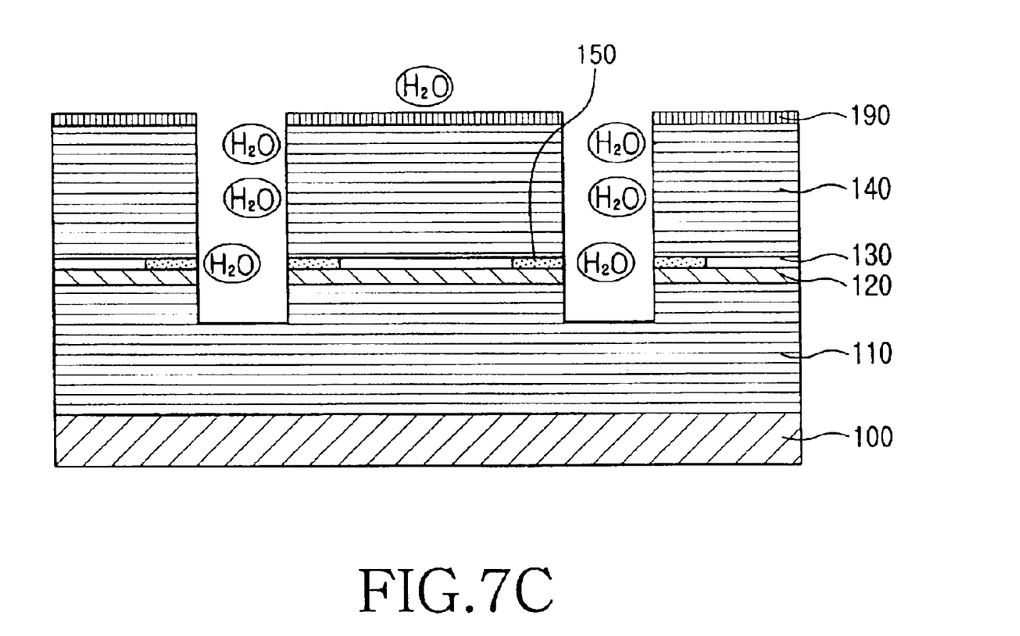

Upon being exposed to the oxidation environment after forming one or more segmented trenches as shown in FIG. 7c, the oxidable layer 130 is inwardly (in the direction I) oxidated from the portions exposed by the segmented trenches, thereby forming the insulation regions 150. If a protection layer 190 has been formed, the protection layer 190 is removed after the insulation regions 150 are formed.

Figure 7D:
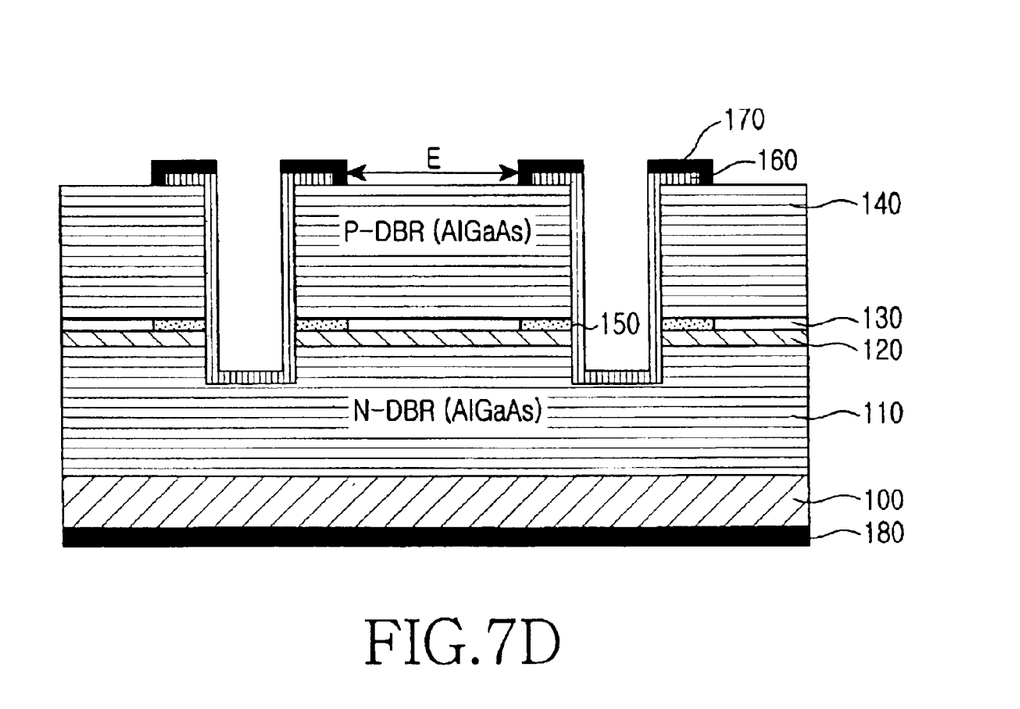

Finally, as shown in FIG. 7d, insulation films 160 are formed to cover the bottom and side walls of the one or more segmented trenches B and to cover the upper reflector layer around the trenches B and then the upper and lower electrodes 170 and 180 are formed, thereby completing the fabrication of a VCSEL.

As described above, according to the present invention, it is possible to control the oxidation rates of an oxidable layer in which an aperture is formed for guiding the flow of electric currents of a V CSEL, by forming a mesa trench of the V CSEL in a segmented structure which has a predetermined number of segments. Accordingly, it is possible to form an aperture which has a shape near to a circle, so that the light emitting angle and shape of the VCSEL are easily controlled.

Furthermore, the mesa trench of the segmented structure formed to control the oxidation rates of an oxidable layer may also serve as a structure for reinforcing the strength against stresses to be applied, the mesa trench of the segmented structure can enhance a reliability of the VCSEL device as compared the existing donut-shaped trench structure.

While the invention has been shown and described with reference to certain preferred embodiments thereof, it will be understood by those skilled in the art that various changes in form and details may be made therein without departing from the spirit and scope of the invention as defined by the appended claims. For example, while four trenches are disclosed, this amount can vary significantly according to the specific design. Accordingly, the scope of the invention is not to be limited by the above embodiments but by the claims and the equivalents thereof.

What is claimed is:

1. A vertical cavity surface emitting laser comprising:
   a substrate;
   a lower reflector layer laminated on the substrate;
   an active layer formed on the lower reflector, the active layer generating light;
   one or more insulation regions formed on the active layer by an oxidable layer to define an aperture for guiding a flow of electric currents;
   an upper reflector layer laminated on the insulation regions;
   one or more upper electrode formed on the upper reflector layer; and a lower electrode formed on the bottom surface of the substrate, the laser having at least one longitudinal segment of what prior to segmentation would constitute a trench whose two ends curve to meet and thereby form a closed curve, a depth of the at least one segment being extended through the upper reflector layer and the active layer and into at least part of the lower reflector layer, said at least one segment being configured to achieve a spatial oxidation pattern of predetermined shape by compensating for lattice-directionality-based variation of oxidation rates; and
   an insulation film formed to cover the bottom and side walls of said at least one segment.

2. The vertical cavity surface emitting laser according to claim 1, wherein the configuring spatially arranges said at least one segment to minimize, during an oxidation process for forming the insulation regions, an area of contact between a more rapidly oxidable portion of the laser and water vapor.

3. The vertical cavity surface emitting laser according to claim 1, wherein an oxidation rate for the achieving of said pattern is determined by a size of one or more of said at least one longitudinal segment.

4. The vertical cavity surface emitting laser according to claim 1, wherein an oxidation rate for the achieving of said pattern is determined by a quantity of the number of segments.

5. The vertical cavity surface emitting laser according to claim 1, wherein an oxidation rate for the achieving of said pattern is determined by a thickness of the oxidable layer.

6. The vertical cavity surface emitting laser according to claim 1, wherein an oxidation rate for the achieving of said pattern is determined by the sizes and quantities of the segments.

7. The vertical cavity surface emitting laser according to claim 1, wherein said at least one segment comprises four segments.

8. The vertical cavity surface emitting laser according to claim 2, wherein said at least one segment comprises four segments.

9. The vertical cavity surface emitting laser according to claim 6, wherein said at least one segment comprises four segments.

10. The vertical cavity surface emitting laser according to claim 2, wherein the aperture for guiding a flow of electric currents is circularly-shaped.

11. The vertical cavity surface emitting laser according to claim 1, further comprising a removable protection layer coated on the upper reflector layer.

12. A laser array comprising a plurality of the vertical cavity surface emitting laser according to claim 1 formed on a single substrate, wherein a spacing portion is formed between each adjacent vertical cavity surface emitting laser beyond one or more trenches so that each vertical cavity surface emitting laser in said array is independently actuable.

13. A method of fabricating a vertical cavity surface emitting comprising the steps of:
   (a) providing a substrate;
   (b) laminating a lower reflector layer, an active layer, an oxidable layer, and an upper reflector layer on the substrate;
   (c) forming a mask pattern of a segmented structure on the upper reflector layer and then forming, in accordance with the segmented structure and by performing an etching process using the mask pattern as an etching pattern, at least one longitudinal segment of what prior to segmentation would constitute a trench whose two ends curve to meet and thereby form a closed curve, wherein a depth of the at least one segment is extended through the upper reflector layer, the oxidable layer and the active layer, and into at least a part of the lower reflector layer, the forming of the mask pattern and said at least one segment being performed such that said at least one segment is configured to achieve a spatial oxidation pattern of predetermined shape by compensating for lattice-directionality-based variation of oxidation rates;
   (d) exposing the oxidable layer to an oxidation environment for a predetermined length of time so that the oxidable layer is selectively oxidized, thereby forming one or more insulation regions, the central part of which is formed with an aperture;
   (e) forming an insulation film to cover the bottom and side walls of the segments and on the portions of the upper reflector layer surrounding the segments so that at least a part of the upper reflector layer is exposed, thereby forming a window;
   (f) forming one or more upper electrodes on the insulation film, wherein the electrodes are in contact with the upper reflector layer at the periphery of the window; and
   (g) forming a lower electrode on the bottom surface of the substrate.

14. The method according to claim 13, wherein step (b) further includes: forming a protection film for preventing oxidation on the upper reflector layer prior to forming said at least one segment.

15. The method according to claim 14, wherein the protection film formed on the upper reflector layer comprises SiO.sub.2.

16. The method according to claim 14, further comprising the step of removing the protective film after the oxidation step through a wet or dry etching process.

17. The method according to claim 13, wherein said at least one segment consists of four segments.

18. The method according to claim 13, wherein the aperture in the central part is substantially circular in shape.

19. The method according to claim 13, wherein the selective oxidation of the oxidable layer in step (d) is determined by a size of the one or more of said at least one segment.

20. The method according to claim 13, wherein the selective oxidation of the oxidable layer in step (d) is determined by a quantity of the one or more of said at least one segment.

21. The method according to claim 13, wherein the selective oxidation of the oxidable layer in step (d) is determined by a thickness of the oxidable layer.

22. The laser according to claim 1, wherein said shape completely and substantially forms a circle.

23. The laser according to claim 22, wherein the circle defines said aperture.

24. The method according to claim 13, wherein said shape completely and substantially forms a circle.

25. The laser according to claim 1, wherein said at least one segment consists of at least two segments, said at least two segments being irregularly-spaced.

26. The method according to claim 13, wherein said at least one segment consists of at least two segments, said at least two segments being irregularly-spaced.

* * * * *